United States Patent
Xin et al.

(10) Patent No.: US 11,115,964 B2
(45) Date of Patent: Sep. 7, 2021

(54) SYSTEM AND METHOD FOR AUTO-DETECTION OF WLAN PACKETS USING HEADER

(71) Applicant: Huawei Technologies Co., Ltd., Shenzhen (CN)

(72) Inventors: Yan Xin, Kanata (CA); Osama Aboul-Magd, Kanata (CA); Jung Hoon Suh, Kanata (CA)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/043,234

(22) Filed: Feb. 12, 2016

(65) Prior Publication Data

US 2016/0249332 A1    Aug. 25, 2016

Related U.S. Application Data

(60) Provisional application No. 62/219,794, filed on Sep. 17, 2015, provisional application No. 62/115,445, filed on Feb. 12, 2015.

(51) Int. Cl.
*H04W 72/04* (2009.01)
*H04L 27/34* (2006.01)
(Continued)

(52) U.S. Cl.
CPC ..... *H04W 72/042* (2013.01); *H03M 13/6527* (2013.01); *H04L 1/0091* (2013.01); *H04L 5/0053* (2013.01); *H04L 27/0012* (2013.01); *H04L 27/206* (2013.01); *H04L 27/2601* (2013.01); *H04L 27/2613* (2013.01); *H04L 27/3455* (2013.01); *H04L 69/18* (2013.01); *H04L 69/22* (2013.01); *H03M 13/1102* (2013.01); *H03M 13/27* (2013.01); *H03M 13/2906* (2013.01); *H04L 5/0023* (2013.01);
(Continued)

(58) Field of Classification Search
None
See application file for complete search history.

(56) References Cited

U.S. PATENT DOCUMENTS 8,830,917 B1    9/2014   Zhang et al.
8,891,592 B1    11/2014  Zhang et al.
(Continued)

FOREIGN PATENT DOCUMENTS

CN    101647242 A    2/2010
CN    102017488 A    4/2011
(Continued)

OTHER PUBLICATIONS

Tantawy ("High Performance Networks: Technology and Protocols").*

(Continued)

*Primary Examiner* — Jeffrey M Rutkowski
*Assistant Examiner* — Mehedi S Aley
(74) *Attorney, Agent, or Firm* — Slater Matsil, LLP

(57) ABSTRACT

A system and method of auto-detection of WLAN packets includes transmitting in a 60 GHz frequency band a wireless packet comprising a first header, a second header, a payload, and a training field, the first header carrying a plurality of bits, a logical value of a subset of the plurality of bits in the first header indicating the presence of the second header in the wireless packet.

22 Claims, 16 Drawing Sheets

(51) Int. Cl.
| | | |
|---|---|---|
| *H03M 13/00* | (2006.01) | |
| *H04L 27/26* | (2006.01) | |
| *H04L 29/06* | (2006.01) | |
| *H04L 27/00* | (2006.01) | |
| *H04L 1/00* | (2006.01) | |
| *H04L 5/00* | (2006.01) | |
| *H04L 27/20* | (2006.01) | |
| *H03M 13/27* | (2006.01) | |
| *H04W 84/12* | (2009.01) | |
| *H03M 13/11* | (2006.01) | |
| *H03M 13/29* | (2006.01) | |

(52) U.S. Cl.
CPC ........ *H04L 5/0048* (2013.01); *H04L 27/2666* (2013.01); *H04L 2001/0098* (2013.01); *H04W 84/12* (2013.01)

(56) References Cited

U.S. PATENT DOCUMENTS

| | | | |
|---|---|---|---|
| 9,584,262 B2* | 2/2017 | Kim | H04L 1/08 |
| 2005/0223193 A1* | 10/2005 | Knownles | G06F 9/30036 |
| | | | 712/214 |
| 2007/0121946 A1* | 5/2007 | Ito | H04L 1/0057 |
| | | | 380/270 |
| 2008/0181320 A1* | 7/2008 | Asanuma | H04L 1/08 |
| | | | 375/260 |
| 2008/0181323 A1 | 7/2008 | Waters et al. | |
| 2008/0244352 A1* | 10/2008 | Kwon | H04L 1/1607 |
| | | | 714/748 |
| 2009/0149132 A1 | 6/2009 | LeFever et al. | |
| 2009/0185549 A1* | 7/2009 | Shon | H04L 69/04 |
| | | | 370/349 |
| 2009/0285319 A1 | 11/2009 | Zhang et al. | |
| 2009/0290600 A1 | 11/2009 | Tatsuta et al. | |
| 2010/0091911 A1 | 4/2010 | Sawai et al. | |
| 2010/0260159 A1 | 10/2010 | Zhang et al. | |
| 2010/0329366 A1* | 12/2010 | Wang | H04L 5/0023 |
| | | | 375/259 |
| 2011/0044271 A1* | 2/2011 | Hong | H04W 28/06 |
| | | | 370/329 |
| 2011/0051705 A1 | 3/2011 | Jones, IV et al. | |
| 2011/0063991 A1 | 3/2011 | Sampath et al. | |
| 2011/0116487 A1 | 5/2011 | Grandhi | |
| 2011/0149927 A1 | 6/2011 | Stacey et al. | |
| 2011/0235721 A1 | 9/2011 | Chen et al. | |
| 2012/0057483 A1* | 3/2012 | Kim | H04L 27/2602 |
| | | | 370/252 |
| 2012/0155447 A1 | 6/2012 | Vermani et al. | |
| 2012/0201276 A1 | 8/2012 | Zhang et al. | |
| 2012/0207181 A1 | 8/2012 | Zhang et al. | |
| 2012/0207192 A1 | 8/2012 | Zhang et al. | |
| 2012/0294295 A1* | 11/2012 | Webster | H04L 27/2602 |
| | | | 370/338 |
| 2013/0064124 A1 | 3/2013 | Sun | |
| 2013/0107912 A1 | 5/2013 | Ponnampalam | |
| 2013/0136198 A1 | 5/2013 | Chavali et al. | |
| 2013/0150033 A1 | 6/2013 | Gossain et al. | |
| 2013/0235884 A1* | 9/2013 | Mamidwar | H04L 25/14 |
| | | | 370/468 |
| 2013/0322279 A1 | 12/2013 | Chincholi et al. | |
| 2014/0071892 A1 | 3/2014 | Liu et al. | |
| 2014/0086362 A1* | 3/2014 | Dhayni | H04B 1/10 |
| | | | 375/329 |
| 2014/0126390 A1 | 5/2014 | Teplitsky et al. | |
| 2014/0133592 A1* | 5/2014 | Ko | H04L 69/22 |
| | | | 375/261 |
| 2014/0146716 A1 | 5/2014 | Chen et al. | |
| 2014/0204927 A1 | 7/2014 | Horn et al. | |
| 2014/0204928 A1 | 7/2014 | Sorin | |
| 2014/0233478 A1 | 8/2014 | Wentink et al. | |
| 2014/0321479 A1* | 10/2014 | Zhang | H04L 69/22 |
| | | | 370/474 |
| 2014/0369213 A1 | 12/2014 | Kim et al. | |
| 2015/0200720 A1 | 7/2015 | Moulsley et al. | |
| 2015/0244432 A1* | 8/2015 | Wang | H04B 7/0695 |
| | | | 375/267 |
| 2015/0381311 A1 | 12/2015 | Zhang et al. | |
| 2016/0006557 A1 | 1/2016 | Shirakawa et al. | |
| 2016/0150591 A1* | 5/2016 | Tarighat Mehrabani | H04L 27/18 |
| | | | 370/329 |
| 2016/0192363 A1* | 6/2016 | Kasher | H04W 72/0453 |
| | | | 370/329 |
| 2016/0204898 A1 | 7/2016 | Ghosh et al. | |
| 2016/0226622 A1* | 8/2016 | Kasher | H04L 1/0072 |
| 2017/0171861 A1* | 6/2017 | Seok | H04L 27/0006 |

FOREIGN PATENT DOCUMENTS

| | | |
|---|---|---|
| CN | 102246450 A | 11/2011 |
| EP | 2175445 A3 | 5/2010 |
| EP | 2712138 A2 | 3/2014 |
| JP | 2008010904 A | 1/2008 |
| JP | 2011527854 A | 11/2011 |
| JP | 2012504378 A | 2/2012 |
| JP | 2013503566 A | 1/2013 |
| JP | 2013515435 A | 5/2013 |
| JP | 2013526119 A | 6/2013 |
| JP | 2013532443 A | 8/2013 |
| JP | 2014504097 A | 2/2014 |
| KR | 20120023610 A | 3/2012 |
| KR | 20120064088 A | 6/2012 |
| KR | 20120104236 A | 9/2012 |
| KR | 20140142356 A | 12/2014 |
| WO | 2008117987 A1 | 10/2008 |
| WO | 2010005775 A1 | 1/2010 |
| WO | 2010120692 A1 | 10/2010 |
| WO | 2014011668 A1 | 1/2014 |
| WO | 2014132599 A1 | 9/2014 |
| WO | 2016126578 A1 | 8/2016 |

OTHER PUBLICATIONS

"High Performance Networks: Technology and Protocols"). (Year: 1994).*
Cordeiro, "IEEE P802.11 Wireless LANS, 802.11 NG60 SG Proposed PAR," IEEE 802.11-14/1151r3, Sep. 14, 2014, 5 pages.
"Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications," IEEE P802.11aj/D1.0, Nov. 2015, 329 pages.
"IEEE Standard for Information Technology—Telecommunications and Information Exchange Between Systems, Local and Metropolitan Area Networks—Specific Requirements; Part 11: Wireless LAN Medium Access Control (MAC) and Physical Layer (PHY) Specifications," IEEE Computer Society, IEEE Std 802.11ad-2012, Dec. 28, 2012, 628 pages.
Tantawy, Ahmed N., "High Performance Networks: Technology and Protocols," Springer Science+Business Media, LLC, 1994, retrieved from https://books.google.com/books?id=yu4HCAAAQBAJ&pg=PA217&lpg=PA217&dq=header+check+sequence+is+determined&source=bl&ols=eTde7wKPga&sig=t42QtrNjRp5wQXRgyUx-pOSRol8&hl=en&sa=X&ved=0ahUKEwjO1lbJ6IvMAhWlyT4KHR14AZoQ6AEIKTAC#v=onepage&q=header%20check%20sequence%20is%20determined&f=false, downloaded on Jun. 8, 2016, pp. 217-218.
Part 11: Wireless LAN Medium Access Control (MAC) and Physical Layer (PHY) Specifications; Amendment 3: Enhancements for Very High Throughput in the 60 GHz Band, IEEE Std 802.11ad.-2012, Dec. 28, 2012, pp. 439-478.
Grieve, David, "Annex L update for the Dband", Wireless LANs, IEEE Draft Document 802.11-12/0077r0, Agilent, Jan. 20, 2012, XP017672872, total 36 pages.
Agilent Technologies, "Wireless LAN at 60 GHz—IEEE 802.11ad Explained," https://www.cs.odu.edu/~cs752/papers/milli-008.pdf, May 30, 2013, 28 pages, USA.

(56) References Cited

OTHER PUBLICATIONS

Texas Instruments, "WLAN Channel Bonding: Causing Greater Problems Than it Solves", SPLY003, White Paper, 12 Pages. Sep. 2003.

* cited by examiner

SYSTEM AND METHOD FOR AUTO-DETECTION OF WLAN PACKETS USING HEADER

This patent application claims priority to U.S. Provisional Application No. 62/115,445, filed on Feb. 12, 2015, and entitled "Method and Apparatus for Auto-Detection of WLAN Packets," and U.S. Provisional Application No. 62/219,794, filed on Sep. 17, 2015, and entitled "System and Method for Auto-Detection of 60 GHz WLAN Packets in STF," both of which are hereby incorporated herein by reference.

TECHNICAL FIELD

The present invention relates generally to wireless networks, and in particular embodiments, to techniques and mechanisms for auto-detection of wireless local area network (WLAN) packets.

BACKGROUND

With the increasing demands of high-definition (HD) displays and other applications, and with the widespread usage of smart phones and tablets, next generation WLANs capable of transmission at higher data rates are needed. IEEE 802.11ad (sometimes called Directional Multi-Gigabit (DMG)) is a WLAN technique that operates in the globally unlicensed 60 GHz band, e.g., 57-66 GHz. Next generation 60 GHz WLANs (NG60) proposed in IEEE 802.11ay (sometimes called enhanced DMG (EDMG)) are capable of even higher performance than 802.11ad. Although such networks may be capable of higher performance, there is also a need for them to be compatible with current 802.11ad devices.

SUMMARY OF THE INVENTION

Technical advantages are generally achieved by embodiments of this disclosure, which describe auto-detection of WLAN packets.

In accordance with an embodiment, a method is provided. The method includes transmitting in a 60 GHz frequency band a wireless packet comprising a first header, a second header, a payload, and a training field, the first header carrying a plurality of bits, a logical value of a subset of the plurality of bits in the first header indicating the presence of the second header in the wireless packet.

In some embodiments, the first header carries at least one parameter for a first packet type, and the second header carries at least one parameter for a second packet type. In some embodiments, the at least one parameter for the second packet type in the second header comprises a number of bonded channels, a MIMO type, a MIMO order, or a combination thereof. In some embodiments, the first packet type is an IEEE 802.11ad packet type and the second packet type is an IEEE 802.11ay packet type. In some embodiments, the wireless packet is a control packet, and the plurality of bits includes 24 bits. In some embodiments, the wireless packet is one of a SC or OFDM packet, and the plurality of bits includes 48 bits.

In accordance with another embodiment, a method is provided. The method includes receiving on a 60 GHz band a wireless packet comprising a first header, a second header, a payload, and a training field, the first header carrying a plurality of bits, and determining the presence of the second header in the wireless packet according to a logical value of a subset of the plurality of bits in the first header.

In some embodiments, the first header carries at least one parameter for a first packet type, and the second header carries at least one parameter for a second packet type. In some embodiments, the at least one parameter for the second packet type in the second header comprises a number of bonded channels, a MIMO type, a MIMO order, or a combination thereof. In some embodiments, the first packet type is an IEEE 802.11ad packet type and the second packet type is an IEEE 802.11ay packet type. In some embodiments, the wireless packet is a control packet, and the plurality of bits includes 24 bits. In some embodiments, the wireless packet is one of a SC or OFDM packet, and the plurality of bits includes 48 bits.

In accordance with yet another embodiment, a method is provided. The method includes transmitting on a 60 GHz band a wireless packet comprising a first header, a second header, a payload, and a training field, the first header carrying at least one parameter for a first packet type, the second header carrying at least one parameter for a second packet type, the first header being modulated with a first modulation scheme indicating the presence of the second header in the wireless packet.

In some embodiments, the wireless packet further comprises a first short training field, a first channel estimation field, and a second channel estimation field, and the second header is positioned between the first header and the payload in the wireless packet. In some embodiments, the second header is modulated with a second modulation scheme different than the first modulation scheme. In some embodiments, the first modulation scheme comprises differential BPSK, the second modulation scheme comprises differential QBPSK, and the wireless packet comprises a control packet. In some embodiments, the first modulation scheme comprises $\pi/2$-shifted BPSK, the second modulation scheme comprises $\pi/2$-shifted QBPSK, and the wireless packet comprises a single carrier packet. In some embodiments, the first modulation scheme comprises QPSK, the second modulation scheme comprises $\varphi$-shifted QPSK, $\varphi$ is a phase shift such that $\varphi \neq \pi/2$, and the wireless packet comprises an orthogonal frequency-division multiplexing packet. In some embodiments, the first packet type is an IEEE 802.11ad packet type and the second packet type is an IEEE 802.11ay packet type.

In accordance with yet another embodiment, a method is provided. The method includes transmitting on a 60 GHz band a wireless packet comprising a first header, a second header, a payload, and a training field, the first header carrying a plurality of bits and a header check sequence for the plurality of bits, the plurality of bits being arranged with an arrangement indicating the presence of the second header in the wireless packet, the header check sequence determined before arranging the plurality of bits.

In some embodiments, the arrangement of the plurality of bits is determined according to a known bit interleaving pattern. In some embodiments, the arrangement of the plurality of bits is determined according to a known bit scrambling pattern. In some embodiments, the first header carries at least one parameter for a first packet type, wherein the second header carries at least one parameter for a second packet type, wherein the first packet type is an IEEE 802.11ad packet type and the second packet type is an IEEE 802.11ay packet type.

BRIEF DESCRIPTION OF THE DRAWINGS

For a more complete understanding of the present invention, and the advantages thereof, reference is now made to the following descriptions taken in conjunction with the accompanying drawing, in which:

FIGS. 7A-10 show techniques for modulating, coding, and transmitting PPDU parameters for an 802.11ay packet, according to an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

IEEE 802.11ay is currently being developed as a NG60 extension to IEEE 802.11ad, with a goal of achieving extended throughput and range. Disclosed herein is a system and method for using header fields to determine whether a received wireless physical (PHY) packet is an 802.11ad packet or an 802.11ay packet. In some embodiments, header fields in 802.11ay packets are modulated differently than header fields in 802.11ad packets. Accordingly, 802.11ay headers may have different properties than 802.11ad headers such that a receiving access point (AP) may determine the modulation scheme of a header, and thus determine the type of a received packet. In some embodiments, new header fields are introduced for 802.11ay packets. As a result, an 802.11ay receiver may be able to distinguish 802.11ay packets from 802.11ad packets based on the presence of the new header field, and an 802.11ad receiver may be able to discard 802.11ay packets if it unexpectedly encounters the new header field. By automatically determining whether a received signal is an 802.11ad signal or an 802.11ay signal, reduced complexity and power savings may be achieved at a receiver.

Various embodiments may achieve advantages. By performing auto-detection with the header field(s), a receiver may identify whether a received packet is in a desired format at an early stage of reception. In particular, because embodiment PPDUs arrange preamble fields before payload fields of a packet, auto-detection may be performed early in the reception pipeline. Additionally, proper selection of headers for an 802.11ay packet may permit legacy 802.11ad devices to detect the length and modulation coding scheme (MCS) of 802.11ay packets. Ambiguity may thus be reduced during auto-detection for both 802.11ad and 802.11ay receivers by permitting an early determination of the type of packet being received.

Figure 1:
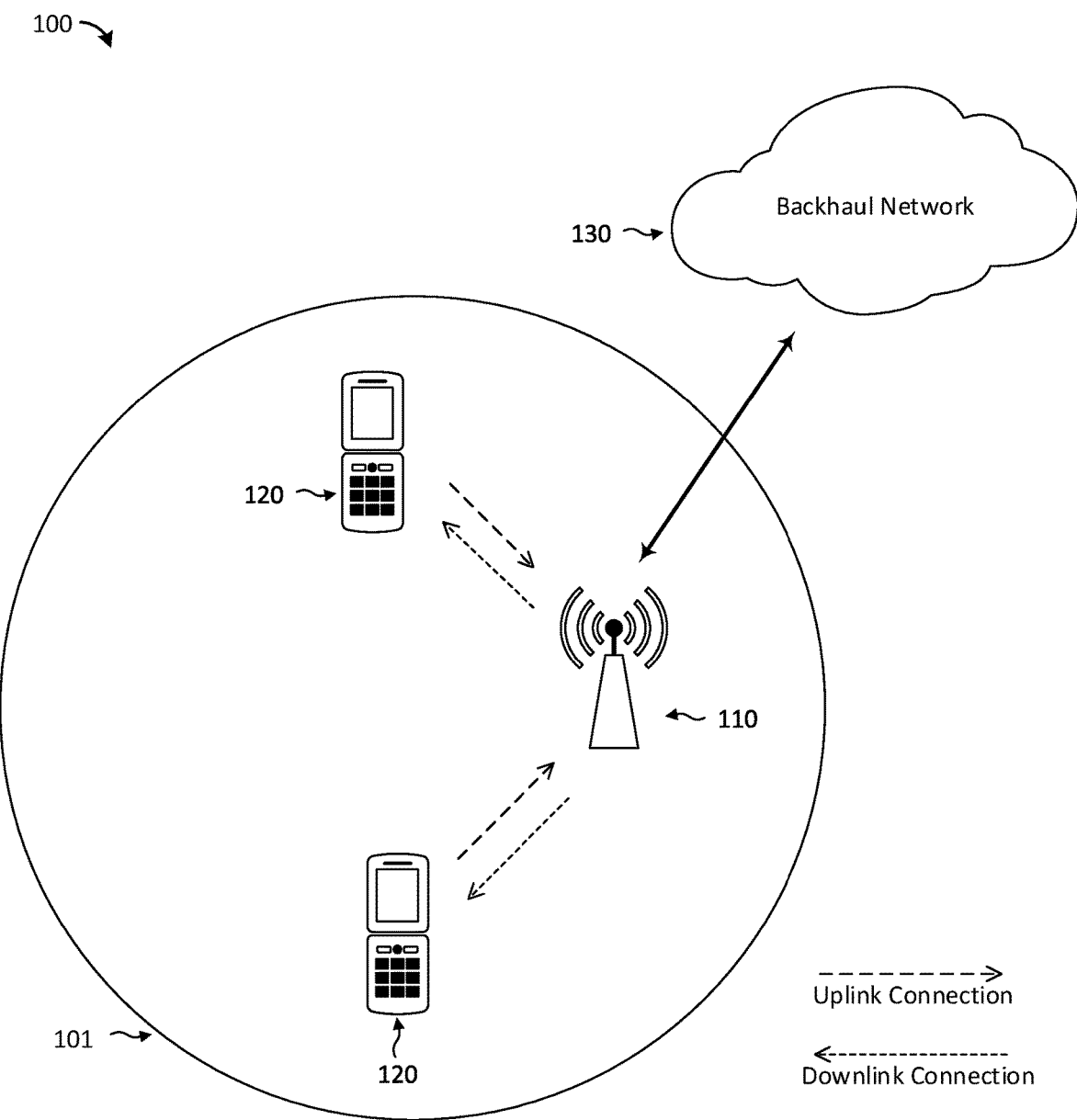
FIG. 1 is a diagram of an embodiment wireless communications network.

FIG. 1 is a diagram of a network 100 for communicating data. The network 100 comprises an AP 110 having a coverage area 101, a plurality of mobile devices 120, and a backhaul network 130. As shown, the AP 110 establishes uplink (dashed line) and/or downlink (dotted line) connections with the mobile devices 120, which serve to carry data from the mobile devices 120 to the AP 110 and vice-versa. Data carried over the uplink/downlink connections may include data communicated between the mobile devices 120, as well as data communicated to/from a remote-end (not shown) by way of the backhaul network 130. As used herein, the term "access point" refers to any component (or collection of components) configured to provide wireless access in a network, such as an evolved NodeB (eNB), a macro-cell, a femtocell, a Wi-Fi AP, or other wirelessly enabled devices. Base stations may provide wireless access in accordance with one or more wireless communication protocols, e.g., long term evolution (LTE), LTE advanced (LTE-A), High Speed Packet Access (HSPA), Wi-Fi 802.11a/b/g/n/ac, etc. As used herein, the term "mobile device" refers to any component (or collection of components) capable of establishing a wireless connection with an AP, such as a user equipment (UE), a mobile station (STA), and other wirelessly enabled devices. In some embodiments, the network 100 may comprise various other wireless devices, such as relays, low power nodes, etc. Embodiment techniques may be performed on a receiver in the network 100, such as the AP 110.

Packets, sometimes called Physical Layer Convergence Protocol (PLCP) Protocol Data Units (PPDUs), are units of data transmitted over the physical (PHY) layer of a network, e.g., Layer 1 of the Open Systems Interconnection (OSI) model. PPDUs are structured data units that include information such as address information, protocol-control information, and/or user data. The packet structure of a PPDU typically includes a short training field (STF), channel estimation field (CEF), header field, and data payload. In some PPDUs the header field may also include a legacy header field (L-Header) and an 802.11ay header (N-Header) field. Auto-detection may be performed by detecting header field(s) in an 802.11ad/802.11ay PPDU. In particular, header fields used in 802.11ad may be used in 802.11ay with different parameters and/or with a different encoding and/or modulation scheme such that receivers may perform auto-detection of 802.11ay or 802.11ad packets.

Figure 2A:
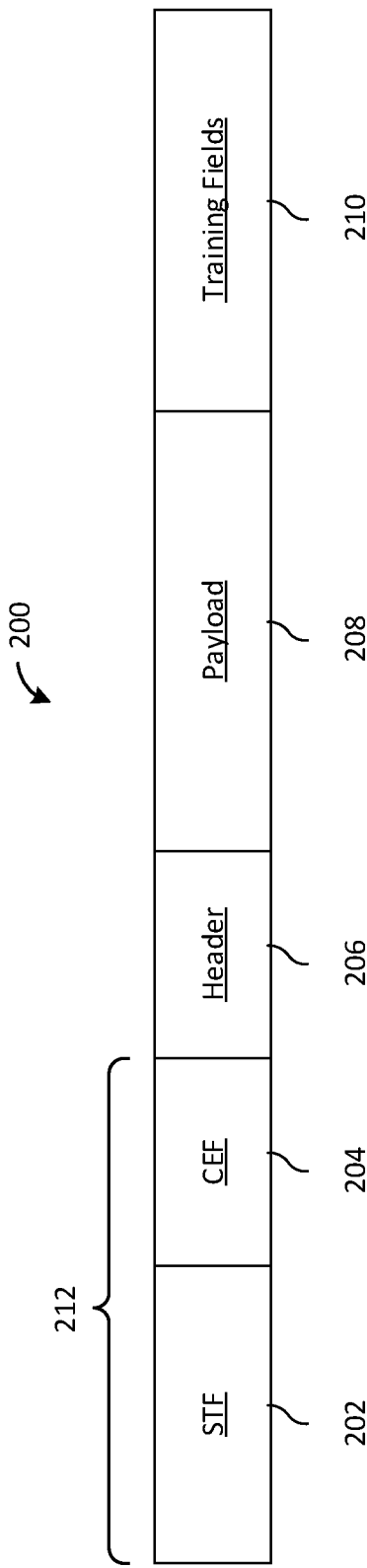
FIGS. 2A-2E are diagrams of an 802.11ad packet.

FIG. 2A is a diagram of a packet 200. The packet 200 is a wireless PHY packet, and may be modulated and encoded with a variety of modulation and coding schemes (MCSs). For example, the packet 200 may be a control, single carrier (SC) or orthogonal frequency-division multiplexing (OFDM) PHY packet, and the MCS may be chosen accordingly. The MCS may be chosen to optimize a variety of characteristics, such as reliability, throughput, or power consumption. For example, messages that need a higher reliability, such as control channel messages, may be transmitted with a control MCS. An MCS that has a lower energy per bit characteristic may be used if lower power consumption or higher throughput is desired, such as for OFDM. The packet 200 may be a packet for 802.11ad, or could be a packet for NG60 networks, e.g., 802.11ay. An 802.11 receiver may determine whether the packet 200 is an 802.11ad or an 802.11ay packet, as well as the packet MCS.

The packet 200 includes an STF 202, a CEF 204, a header 206, a payload 208, and training fields 210. It should be appreciated that the packet 200 could include other fields, and that the fields could be arranged in any order. The STF 202 is used for start-of-packet detection. It may also be used for coarse frequency correction, and for configuring automatic gain control (AGC). The CEF 204 is used for channel estimation. The CEF 204 may also allow the receiver to determine what kind of PHY type (SC PHY or OFDM PHY) was used to communicate the packet 200.

The header 206 may contain indicators or parameters that allow the receiver to decode the payload 208. The header 206 is used to determine whether the packet 200 is an 802.11ad or an 802.11ay PHY packet. In some embodiments, the header 206 contains indicators or parameters that allow this determination to be made. In some embodiments, the packet type is determined through other means, such as determining how the header 206 is modulated and/or encoded. The header 206 may also be used to determine other characteristics of the packet 200, such as the MCS for the payload of the packet. The header 206 may be CRC-coded, and in some embodiments the header 206 may include a checksum or a header check sequence (HCS) for the CRC. The header 206 is 48 bits in length when the packet is a control packet, and is 64 bits in length when the packet is a SC or OFDM packet.

The payload 208 contains the data payload for the packet 200. The training fields 210 include other fields, such as the AGC and training (TRN) subfields, which may be appended to the packet 200.

Figure 2B:
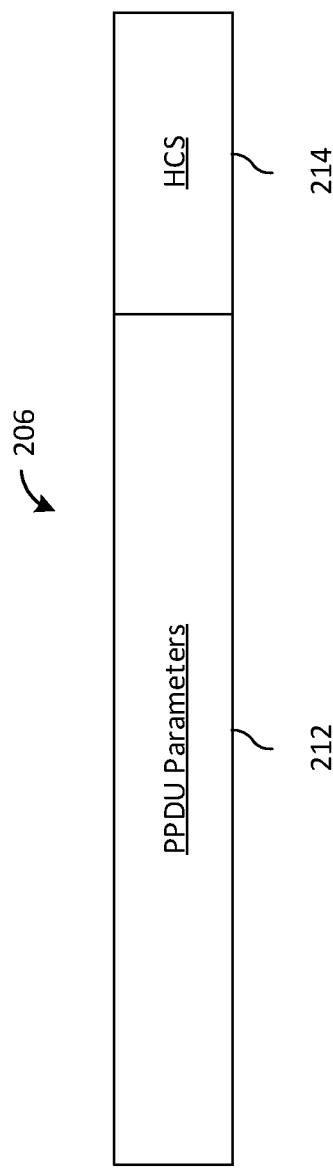

FIG. 2B is a detailed view of the header 206. As shown, the header 206 includes PPDU parameters 212, and a HCS 214. The PPDU parameters 212 include a number of fields for the header 206 (discussed below). The HCS 214 includes error-checking bits for the PPDU parameters 212, such as parity bits for the CRC.

Figures 2C, 2D, 2E:
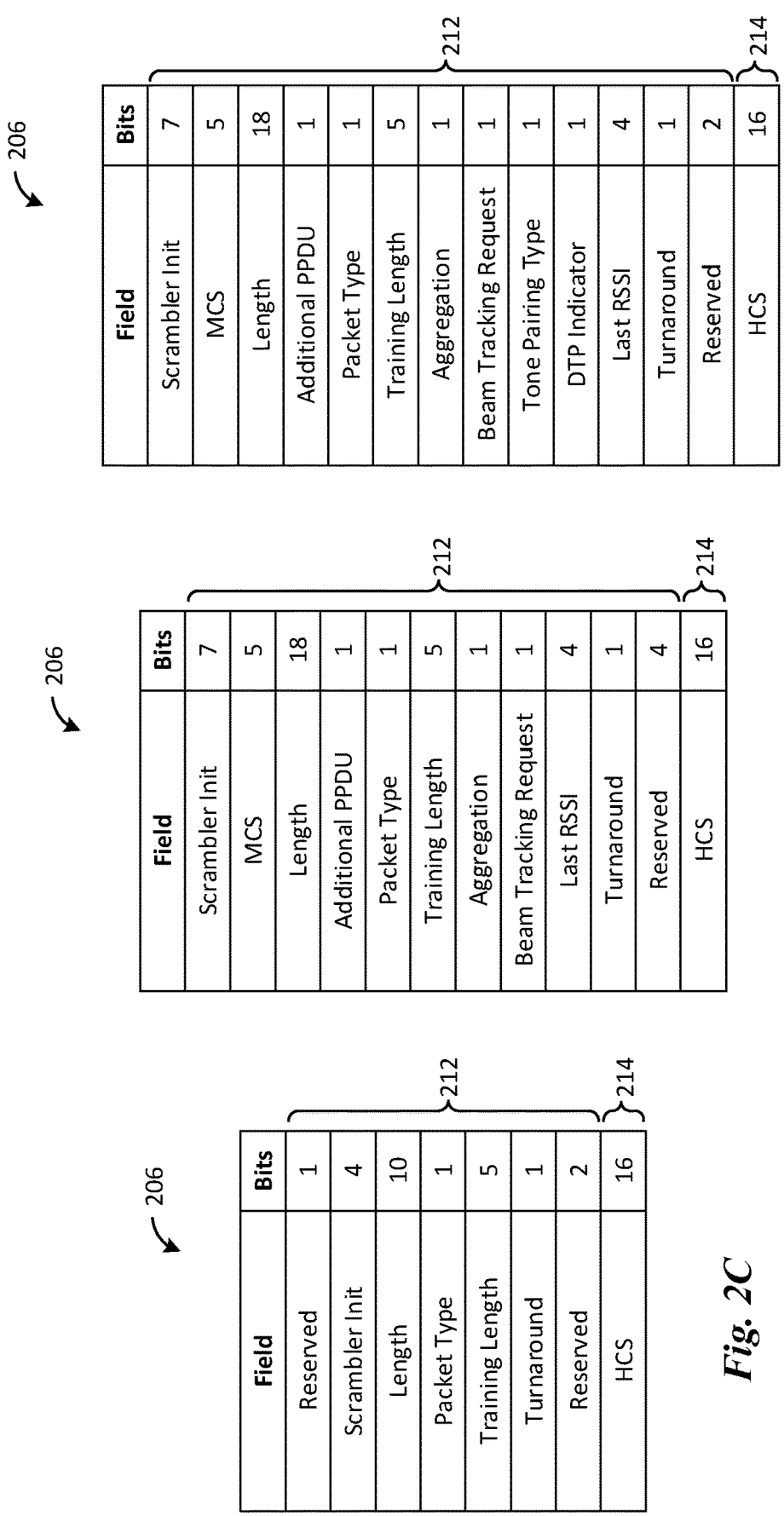

FIGS. 2C-2E are detailed header format diagrams for the header 206. Each detailed header format diagram shows field names and positions, as well as the corresponding bit lengths for each field. For example, the PPDU parameters 212 include fields for the packet length, packet type, training length, parity bits, and the like. FIG. 2C shows embodiments where the header 206 is a control PHY packet header. FIG. 2D shows embodiments where the header 206 is a SC PHY packet header. FIG. 2E shows embodiments where the header 206 is an OFDM PHY packet header. The PPDU parameters 212 include several reserved bits that are not used by 802.11ad. In control packets, the PPDU parameters 212 include 1 leading reserved bit at the beginning of the parameters when the header 206 is a control PHY header. In SC and OFDM packets, the PPDU parameters 212 include 2 to 4 trailing reserved bits that occur at the end of the parameters, before the HCS 214.

Figures 3A, 3B:
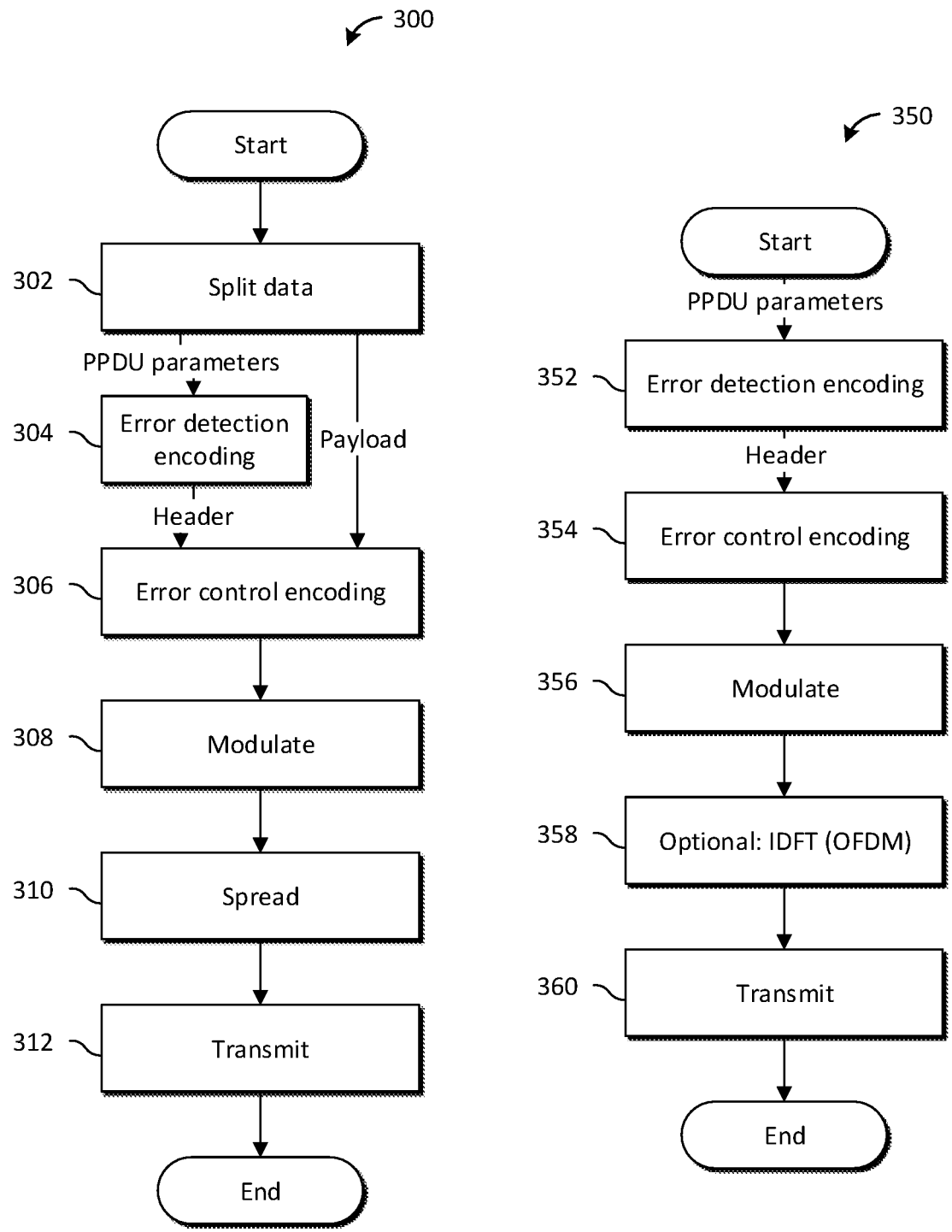
FIGS. 3A-3B show coding methods for 802.11ad packets.

FIG. 3A shows a coding method 300 for modulating, coding, and transmitting PPDU parameters for an 802.11ad control packet. The coding method 300 may be indicative of operations occurring on an 802.11ad transmitter when sending an 802.11ad control PHY packet.

The coding method 300 begins by splitting a control packet into a set of PPDU parameters and a payload (step 302). Error-detection coding is performed on the PPDU parameters to produce a header check sequence (HCS), which is combined with the original PPDU parameters to generate a PHY header (step 304). The PPDU parameters may be coded with, e.g., CRC coding. The PPDU parameters are 24 bits in length and the PHY header is 40 bits in length.

Error control encoding is then applied to the PHY header and the payload (step 306). The error control encoding may be, e.g., low-density parity-check (LDPC) encoding. Coded bits for the packet are produced by the error control encoding.

The packet is then modulated to produce modulated symbols for the coded bits (step 308). The modulation applied to the packet is $\pi/2$-shifted differential binary phase-shift keying ($\pi/2$-DBPSK) modulation. The modulated symbols are spread across the frequency spectrum (step 310). The symbols may be duplicated at different frequencies across a given spectrum. Finally, the spread symbols are then transmitted with an antenna (step 312).

FIG. 3B shows a coding method 350 for modulating, coding, and transmitting PPDU parameters for an 802.11ad SC or OFDM packet. The coding method 350 may be indicative of operations occurring on an 802.11ad transmitter when sending an 802.11ad SC or OFDM PHY packet.

The coding method 350 begins by performing error-detection coding on PPDU parameters for a packet to produce a PHY header that includes a HCS (step 352). The PPDU parameters may be coded with, e.g., CRC coding. The PPDU parameters are 48 bits in length and the PHY header is 64 bits in length.

Error control encoding is then applied to the PHY header (step 354). The error control encoding may be, e.g., low-density parity-check (LDPC) encoding. Coded bits for the packet are produced by the error control encoding.

The packet is then modulated to produce modulated symbols for the coded bits (step 356). In embodiments where the packet is a SC packet, the modulation applied to the packet is $\pi/2$-shifted binary phase-shift keying ($\pi/2$-BPSK) modulation. In embodiments where the packet is an OFDM packet, the modulation applied to the packet is quadrature phase-shift keying (QPSK) modulation. If the packet is an OFDM packet, the modulated symbols are converted to time-domain symbols with an inverse discrete Fourier transformation (IDFT) (step 358). Finally, the spread symbols are then transmitted with an antenna (step 360).

Figure 4:
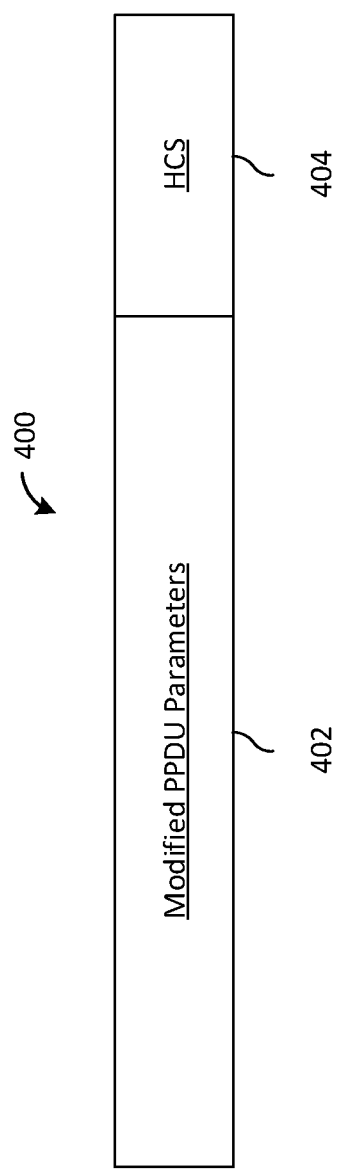
FIGS. 4-6 show techniques for modulating, coding, and transmitting PPDU parameters for an 802.11ay packet, according to an embodiment.
Figure 5:
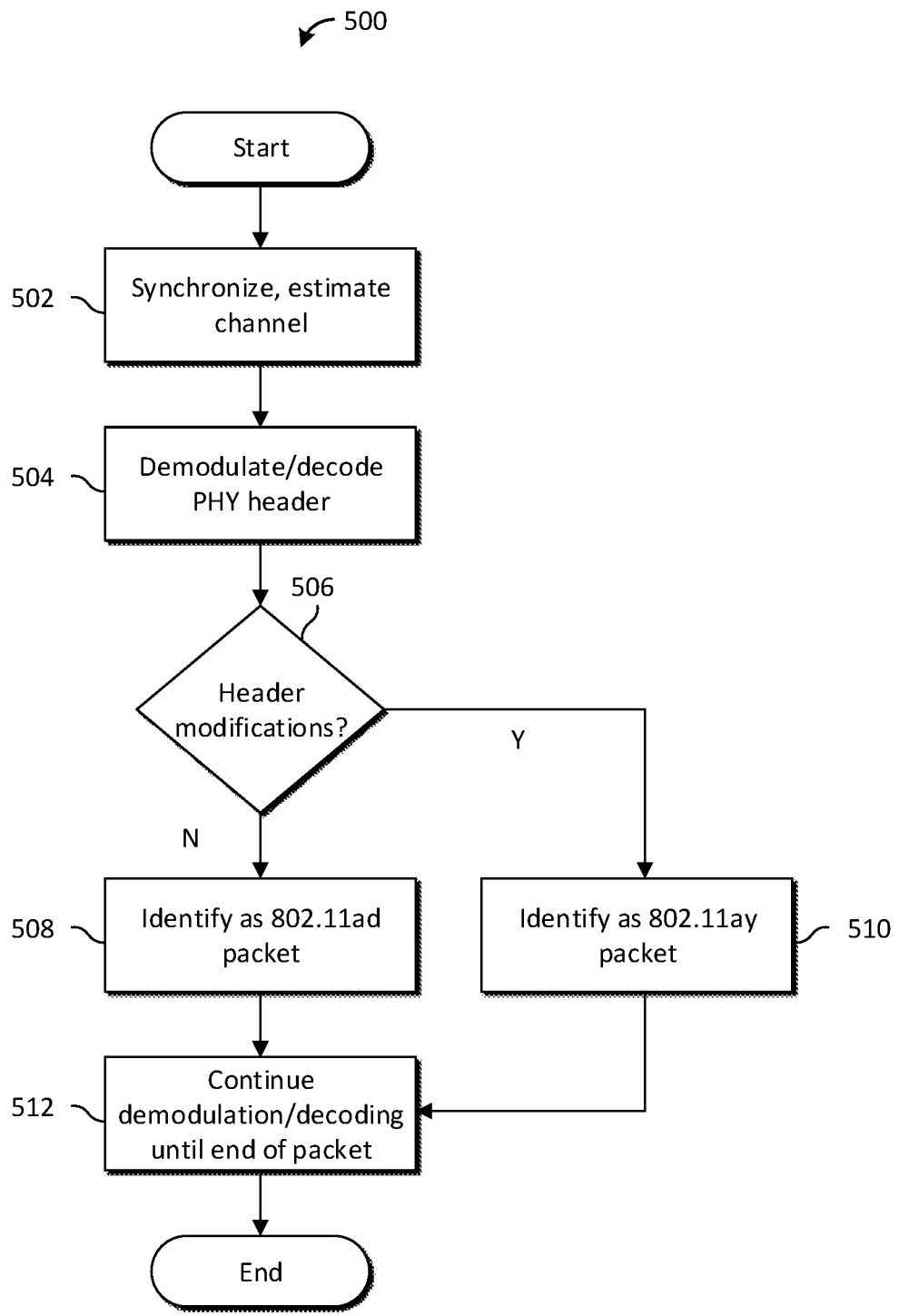
Figure 6:
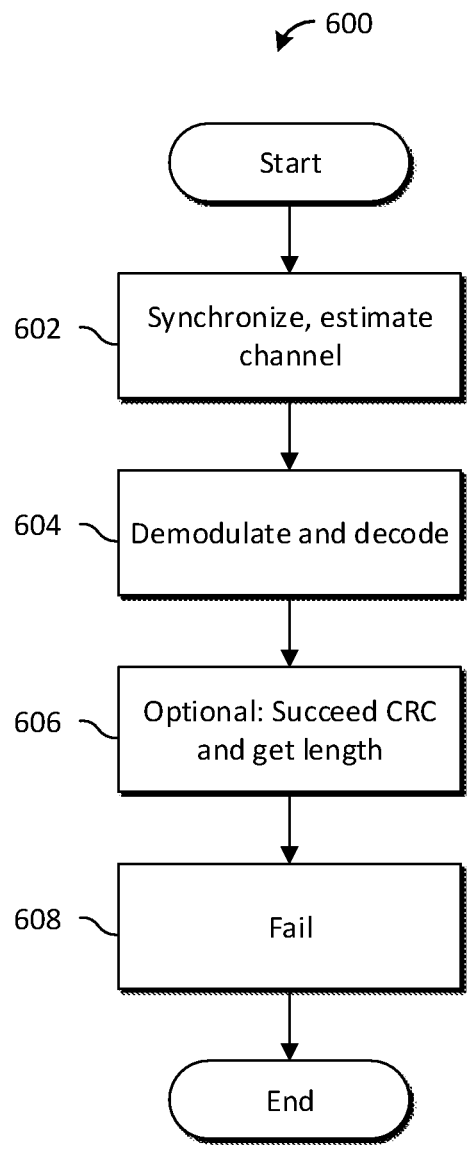

FIGS. 4-6 show techniques for modulating, coding, and transmitting PPDU parameters for an 802.11ay packet. FIG. 4 is a diagram of a header 400. The header 400 is a wireless PHY packet header, and may be modulated and encoded with a variety of MCSs. The header 400 may be a header for a control, SC, or OFDM 802.11ay PHY packet. The header 400 is a modified variant of the header 206.

The header 400 includes modified PPDU parameters 402 and a header check sequence (HCS) 404. The modified PPDU parameters 402 are similar in some respects to the PPDU parameters 212 of the header 206, but sufficiently different to permit an 802.11ay receiver to distinguish the header 400 (e.g., an 802.11ay header) from the header 206 (e.g., an 802.11ad header) in a received PHY packet.

The modified PPDU parameters 402 may differ from the PPDU parameters 212 in several ways. In some embodiments, the modified PPDU parameters 402 include indication bits at reserved bit positions in the PPDU parameters 212 indicating that the packet is an 802.11ay packet. For example, some leading or trailing bits in the PPDU parameters 212 are reserved in an 802.11ad packet. Such fields may be used in the header 400 to indicate the presence of an 802.11ay packet.

In embodiments where the header 400 is in an 802.11ay control packet, the modified PPDU parameters 402 are similar to PPDU parameters for an 802.11ad control packet, e.g., the PPDU parameters includes 24 bits. In such embodiments, reserved bits 22 and 23 are set to 1. The existence of these values at bits 22 and 23 indicates the presence of an 802.11ay header field in the packet, and implies that the packet is an 802.11ay control packet.

In embodiments where the header 400 is in an 802.11ay SC or OFDM packet, the modified PPDU parameters 402 are similar to PPDU parameters for an 802.11ad SC or OFDM packet, e.g., the PPDU parameters includes 48 bits. In such embodiments, reserved bit 46 is set to 1. The existence of this value at bit 46 indicates the presence of an 802.11ay header field in the packet, and implies that the packet is an 802.11ay SC or OFDM packet.

In some embodiments, the modified PPDU parameters 402 may be produced by scrambling all or part of the PPDU parameters 212. In some embodiments, the modified PPDU parameters 402 may be produced by interleaving all or part of the PPDU parameters 212. In both of such embodiments, the binary sequence produced for the PHY header is transformed into another binary sequence of the same length. If the binary sequence is interleaved, the order or position of the bits in the sequence is changed according to an interleaving pattern known to both the transmitter and the receiver. If the binary sequence is scrambled, the sequence pattern of the bits in the sequence is changed according to a bit sequence pattern known to both the transmitter and the receiver.

FIG. 5 is a diagram of an auto-detection method 500. The auto-detection method 500 may be indicative of operations occurring on an 802.11ay receiver when auto-detecting an 802.11ay or 802.11ad PHY packet.

The auto-detection method 500 begins by receiving a packet, synchronizing with the transmitter, and performing channel estimation (step 502). The PHY header for the received packet is demodulated and decoded (step 504). The header of the received packet is analyzed to determine whether the packet header contains modifications (step 506). In embodiments where indication bit(s) are placed at reserved bit position(s) in the PPDU parameters, a receiver determines the packet type based on the presence of detected indication bit(s).

In embodiments where all or part of the PPDU parameters are scrambled to produce modified PPDU parameters, a receiver determines the packet type based on whether the received header can be decoded correctly without descrambling. In embodiments where all or part of the PPDU parameters are interleaved to produce modified PPDU parameters, a receiver determines the packet type based on whether the received header can be decoded correctly without deinterleaving. In both of such embodiments the receiver performs a CRC check on the PPDU parameters after decoding the PHY header (in step 506) and matches the check against the HCS in the PHY header. If the parameters are not scrambled or interleaved, then the CRC check succeeds, indicating that the packet header does not contain modifications. If the parameters are scrambled or interleaved then the CRC check fails. The parameters may then be descrambled or deinterleaved and the CRC check performed again. A successful CRC check after descrambling or deinterleaving indicates that the packet header contains modifications If an unmodified header is detected, then the received packet is identified as an 802.11ad packet (step 508). If the receiver detects header modifications, then the packet is identified as an 802.11ay packet (step 510). Finally, packet demodulation and decoding continues until the end of the packet (step 512).

FIG. 6 is a diagram of a detection method 600. The detection method 600 may be indicative of operations occurring on an 802.11ad receiver when detecting an 802.11ay PHY packet.

The detection method 600 begins by receiving a packet, synchronizing with the transmitter, and performing channel estimation (step 602). The header for the received packet is then demodulated and decoded (step 604). In embodiments where the packet is a control packet, the received symbols are despread. In embodiments where the packet is a SC packet, the received symbols are derotated. In embodiments where the packet is an OFDM packet, a discrete Fourier transformation (DFT) is performed to convert the time-domain symbols to frequency-domain symbols.

If the 802.11ay PHY packet was produced by adding indication bit(s) at reserved PPDU parameter bit position(s), then a CRC check on the received packet will succeed (step 606). The CRC check on the received packet succeeds because the resulting 802.11ay PPDU parameters maintain the same bit layout as 802.11 ad PPDU parameters (except for the reserved bits). The PPDU parameters such as the length and MCS of the 802.11ay PHY packet may then be determined by the 802.11ad receiver, and the duration of the packet can be determined based on the detected length and MCS of the packet.

When a failure occurs in the 802.11ad receiver (step 608) after detection of the 802.11ay PPDU parameters in the header, the 802.11ad receiver may enter sleep mode until the end of the packet based on the packet duration. In such embodiments, the failure occurs when attempting to decode a second header (discussed below) or the packet payload.

In embodiments where the 802.11ay PHY packet was produced by scrambling or interleaving PPDU parameters in the header, the CRC check fails because the bit layout of PPDU parameters in the 802.11ay header has been modified.

FIGS. 7A-10 show techniques for modulating, coding, and transmitting PPDU parameters for an 802.11ay packet. In some embodiments, auto-detection is performed through a modified signal constellation. In such embodiments, 802.11ay packets may be modulated differently than 802.11ad packets. Thus, 802.11ay packets may be distinguished from 802.11ad packets by mapping received symbols on a constellation diagram and determining the received PHY packet type according to the locations of the mapped values. Detecting 802.11ay packets with a modified constellation diagram allows the 802.11ay PHY header to differ from an 802.11ad header in several respects, such as the parameters, layout, encoding, etc.

Figures 7A, 7B:
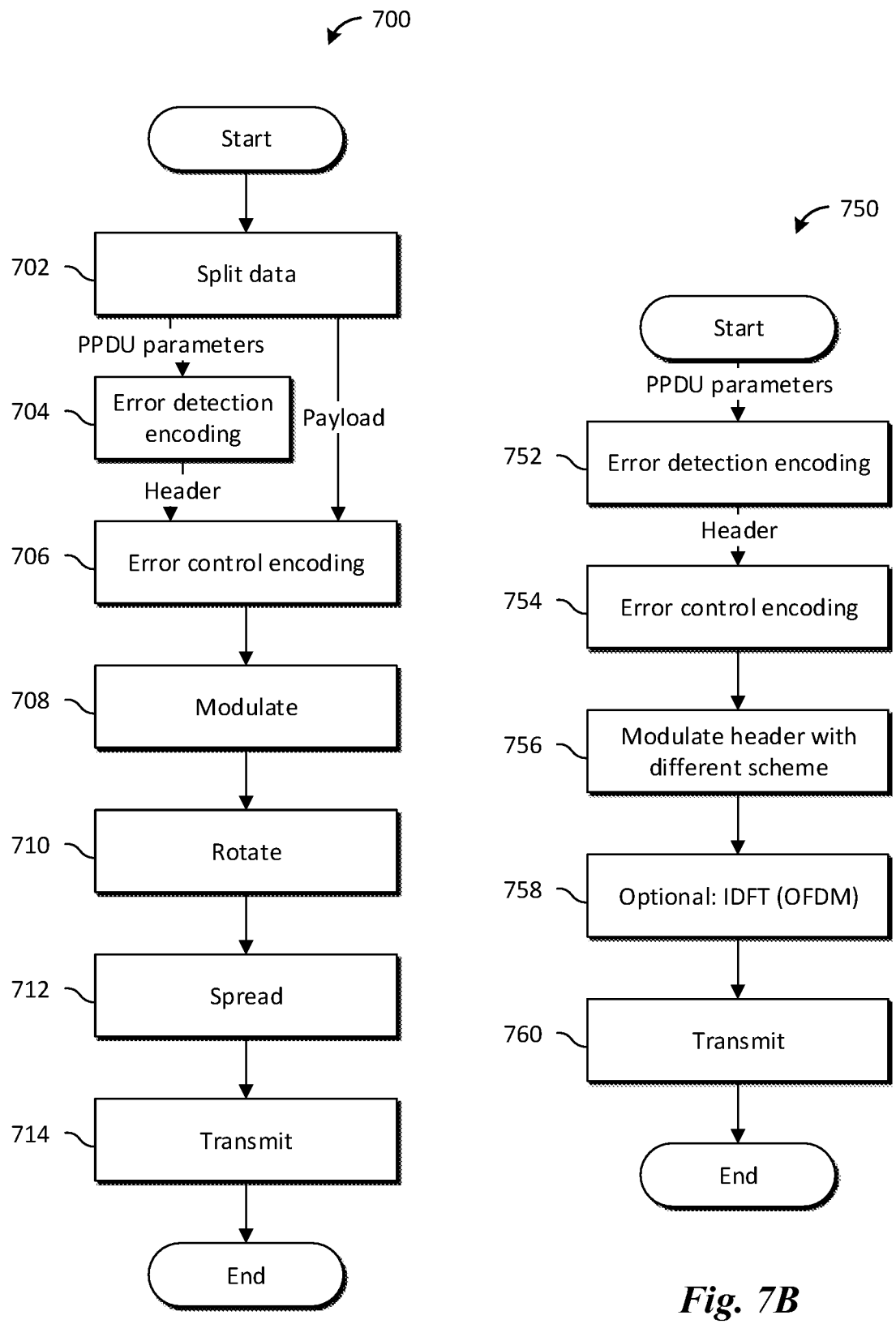

FIG. 7A is a diagram of a coding method 700. The coding method 700 may be indicative of operations occurring on an 802.11ay transmitter when sending an 802.11ay control PHY packet.

The coding method 700 begins by splitting a control PHY packet into PPDU parameters and a payload (step 702). Error-detection coding is performed on the PPDU parameters to produce a PHY header (step 704). The PPDU parameters may be encoded with, e.g., CRC coding. The PHY header may include bits for the original PPDU parameters and error coding bits.

Error control encoding is applied to the PHY header and the packet data (step 706). The error control encoding may be, e.g., low-density parity-check (LDPC) encoding. Coded bits for the packet are produced by the error control encoding.

The packet header is then modulated to produce modulated symbols for the coded bits (step 708). The modulation applied to the packet header is differential quadrature binary phase-shift keying (DQBPSK) modulation. The modulated header symbols are rotated by applying a phase shift (step 710). Each DBPSK-modulated symbol of the control packet is rotated by π/2 to produce differential quadrature binary phase shift keying (DQBPSK) modulated symbols. Accordingly, symbols produced for an 802.11ay control packet header may map to different portions of a constellation diagram than other symbols in the packet or symbols produced for an 802.11ad control packet header.

The modulated symbols in the control packet are spread across the frequency spectrum (step 712). The symbols may be duplicated at different frequencies across a given spectrum. Finally, the symbols are then transmitted with an antenna (step 716).

FIG. 7B is a diagram of a coding method 750. The coding method 750 may be indicative of operations occurring on an 802.11ay transmitter when sending an 802.11ay SC or OFDM PHY packet.

The coding method 750 begins by performing error-detection coding on PPDU parameters for a packet to produce a PHY header that includes a HCS (step 752). The PPDU parameters may be encoded with, e.g., CRC coding. The PHY header may include bits for the original PPDU parameters and error coding bits.

Error control encoding is applied to the PHY header and the packet data (step 754). The error control encoding may be, e.g., low-density parity-check (LDPC) encoding. Coded bits for the packet are produced by the error control encoding.

The packet header is then modulated to produce modulated symbols for the coded bits (step 756). The packet header is modulated with a different scheme than the remainder of the packet. Accordingly, the header is modulated with a scheme for 802.11ay, while remaining portions of the packet are modulated with a scheme for 802.11ad. In embodiments where the packet is a SC packet, the modulation applied to the packet header is π/2-shifted quadrature binary phase-shift keying (π/2-QBPSK) modulation. In embodiments where the packet is an OFDM packet, the modulation applied to the packet header is linear phase-rotated QPSK (referred to as (φ-QPSK). The linear phase-rotation applied, φ, may be a value other than π/2, such as φ=π/8, 3π/8, etc. Because the modulation scheme for an 802.11ay PHY header is different from the modulation scheme for an 802.11ad PHY header, an 802.11ay SC or OFDM packet header may map to different portions of a constellation diagram than symbols produced for an 802.11ad SC or OFDM packet header.

If the packet is an OFDM packet, the modulated symbols are converted to time-domain signals with an inverse discrete Fourier transformation (IDFT) (step 758). Finally, the symbols are then transmitted with an antenna (step 760).

Figure 8:
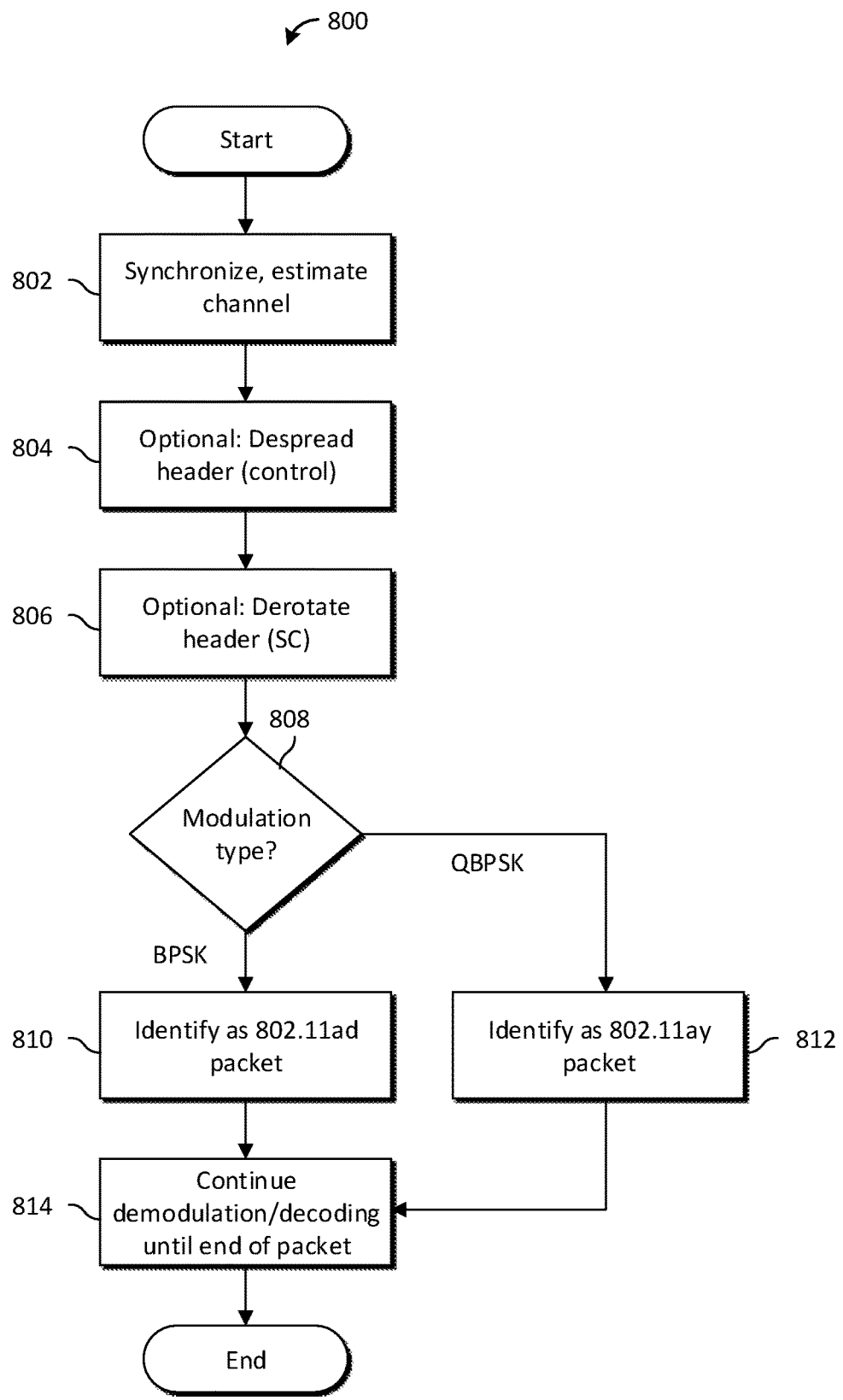

FIG. 8 is a diagram of an auto-detection method 800. The auto-detection method 800 may be indicative of operations occurring on an 802.11ay receiver when auto-detecting an 802.11ay or 802.11ad control or SC PHY packet.

The auto-detection method 800 begins by receiving a packet, synchronizing with the transmitter, and performing channel estimation (step 802). If the packet is a control packet, the symbols in the received packet are despread from across the frequency spectrum (step 804). If the packet is a SC packet, the symbols in the received packet are derotated by applying a linear phase shift of π/2 to the symbols (step 806).

The modulation type of the received symbols is then determined (step 808). The modulation type may be determined by mapping the symbols on a constellation diagram and determining where values lie in the complex plane. Series of symbols that only have values between [j, −j] (where j=√−1) are determined to be differential QPSK modulated, and series of symbols that only have values between [1, −1] are determined to be differential BPSK modulated. Other modulation schemes of the received symbols can likewise be determined by mapping the symbols on a constellation diagram and determining their positions on the diagram.

If the symbols are differential BPSK modulated, then the received packet is identified as an 802.11ad packet (step 810). However, if the symbols are differential QPSK modulated, then the received packet is identified as an 802.11ay packet (step 812). Once the packet type is identified, demodulation and decoding continues until the end of the packet (step 814).

Figure 9:
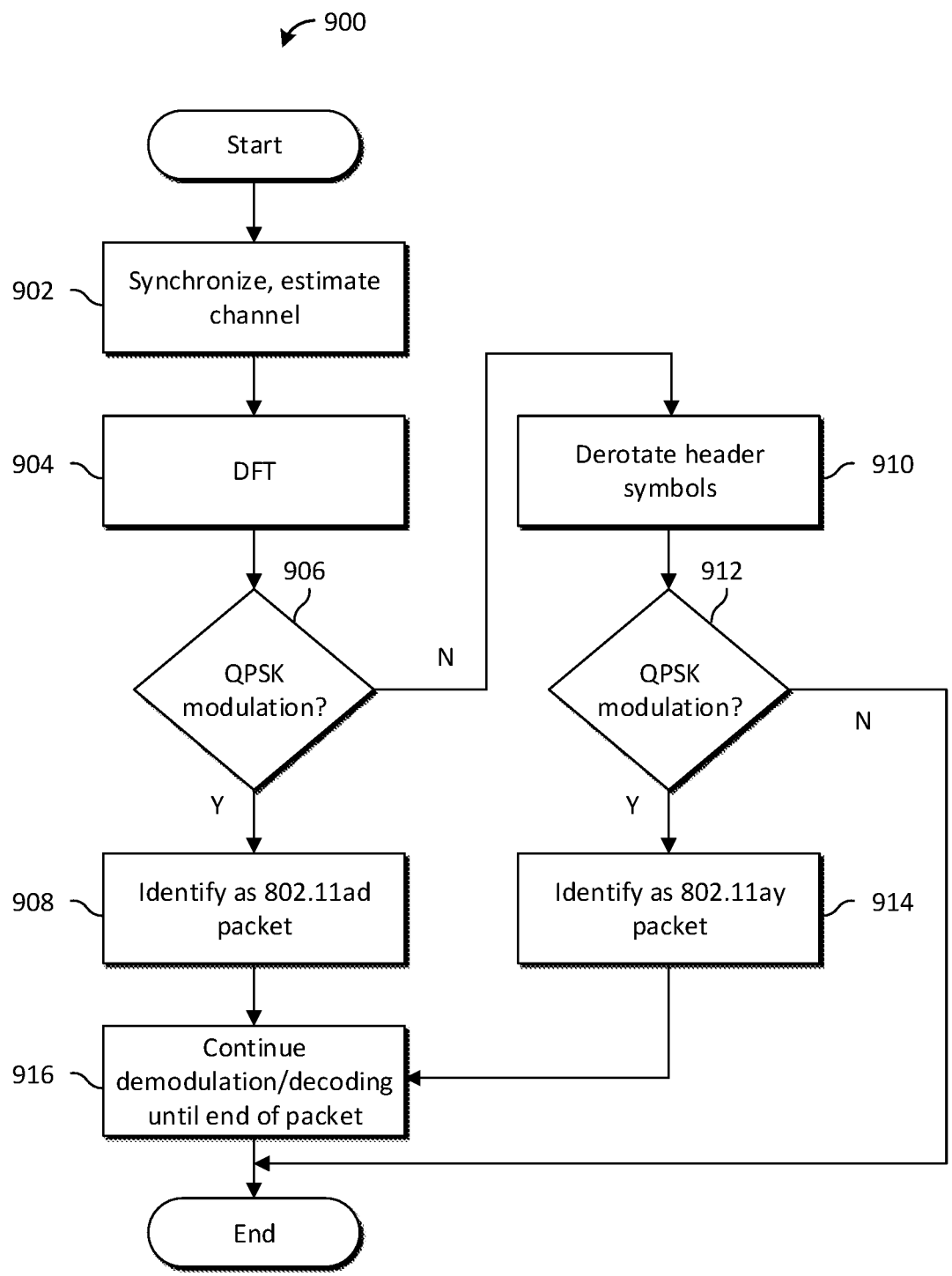

FIG. 9 is a diagram of an auto-detection method 900. The auto-detection method 900 may be indicative of operations occurring on an 802.11ay receiver when auto-detecting an 802.11ay or 802.11ad OFDM PHY packet.

The auto-detection method 900 begins by receiving a packet, synchronizing with the transmitter, and performing channel estimation (step 902). A discrete Fourier transformation (DFT) is then performed on the received packet to transform time-domain signals in the packet to frequency-domain signals (step 904). The auto-detection method 900 determines whether the transformed symbols are QPSK modulated (step 906). The modulation type may be determined by mapping the symbols on a constellation diagram and determining where values lie in the complex plane. If the symbols are QPSK modulated, then the received packet is identified as an 802.11ad packet (step 908). However, if the symbols are not QPSK modulated, then the symbols are derotated by applying the linear phase shift of (p to the symbols (step 910). The auto-detection method 1100 determines whether the derotated symbols are QPSK modulated (step 912). If the derotated symbols are QPSK modulated, then the received packet is identified as an 802.11ay packet (step 914). However, if the derotated symbols are not QPSK modulated, then the packet type cannot be identified. Once the packet type is identified (e.g., with a CRC check), demodulation and decoding continues until the end of the packet (step 916).

Figure 10:
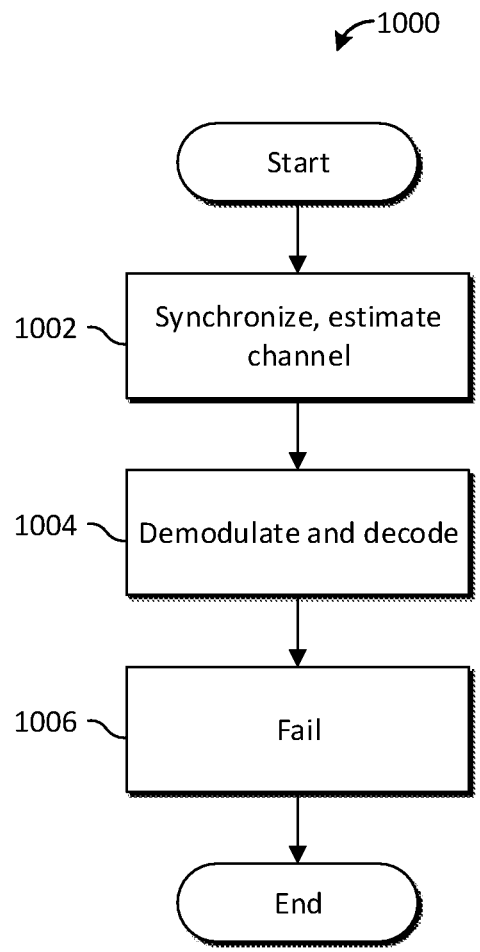

FIG. 10 is a diagram of an auto-detection method 1000. The auto-detection method 1000 may be indicative of operations occurring on an 802.11ad receiver when auto-detecting an 802.11ay PHY packet.

The auto-detection method 1000 begins by receiving a packet, synchronizing with the transmitter, and performing channel estimation (step 1002). The PHY header for the received packet is then demodulated and decoded (step 1004). In embodiments where the packet is a control packet, the received symbols may be despread. In embodiments where the packet is a SC packet, the received symbols may be derotated. In embodiments where the packet is an OFDM packet, a discrete Fourier transformation (DFT) may be performed to convert the time-domain symbols to frequency-domain symbols.

A failure then occurs in the 802.11ad receiver (step 1006). In embodiments where the packet is a control packet, the failure occurs because the receiver attempts to perform differential BPSK demodulation, but fails because the received 802.11ay control PHY header is modulated with differential QBPSK. In embodiments where the packet is a SC packet, the failure occurs because the receiver attempts to perform BPSK demodulation, but fails because the received 802.11ay SC PHY header is modulated with π/2-

QBPSK. In embodiments where the packet is an OFDM packet, the failure occurs because the receiver attempts to perform QPSK demodulation, but fails because the received 802.11ay OFDM PHY header is modulated with φ-QPSK.

FIGS. 11-14 show techniques for modulating, coding, and transmitting PPDU parameters for an 802.11ay packet. In some embodiments, auto-detection is performed by introducing a new header (N-Header) for 802.11ay packets. The N-Header is located in the PPDU parameters for the header proximate the 802.11ad header, sometimes called the "legacy header" (L-Header). In some embodiments, a new channel estimation field (N-CEF) is also introduced for 802.11ay packets, and is located in the PPDU parameters in addition to the CEF used in 802.11ad, sometimes called the "legacy CEF" (L-CEF). The N-Header may include all 802.11ad PPDU parameters and additional fields that indicate support for new features in 802.11ay, such as a quantity of bonded channels, MIMO type and order, and the like. PPDU parameters in the 802.11ad PHY header, e.g., the header 206, may not be sufficient for 802.11ay operations, and the number of reserved bits in the 802.11ad header is limited. Accordingly, a new 802.11ay header is introduced herein. The N-Header is also used for auto-detection of 802.11ad/802.11ay packets. 802.11ay packets with the N-Header may be transmitted using a technique similar to the coding method 700 (shown in FIG. 7)

Figure 11:
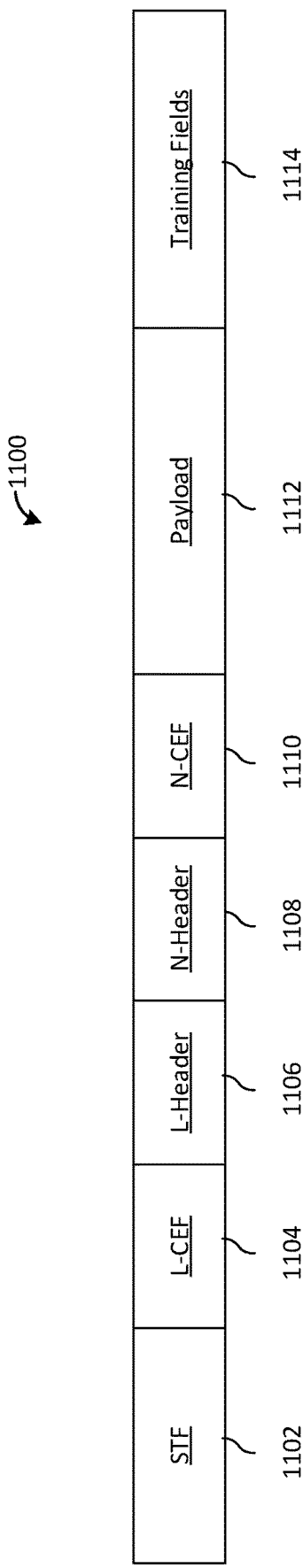
FIGS. 11-14 show techniques for modulating, coding, and transmitting PPDU parameters for an 802.11ay packet, according to an embodiment.

FIG. 11 is a diagram of a PPU format for a packet 1100. The packet 1100 includes a STF 1102, an L-CEF 1104, an L-Header 1106, an N-Header 1108, an N-CEF 1110, a payload 1112, and training fields 1114. The packet 1100 is an 802.11ay control, SC, or OFDM PHY packet.

The packet 1100 is similar in layout to the packet 200, with the addition of new fields for use in NG60 wireless networks. The STF 1102, L-CEF 1104, L-Header 1106, payload 1112, and training fields 1114 correspond to fields in the packet 200, where fields that are described as "legacy" fields correspond to respective fields in the packet 200. In other words, the L-CEF 1104 and the L-Header 1106 represent the CEF 204 and the header 206 in 802.11ad, respectively. Accordingly, descriptions of these fields will not be repeated herein. Likewise, the N-Header 1108 and the N-CEF 1110 represent a new 802.11ay header and CEF.

As discussed above, the N-Header 1108 includes bits to indicate support for new features in 802.11ay, and is used to perform auto-detection of 802.11ay PHY packets. Likewise, the N-CEF 1110 may also be used to perform channel estimation for 802.11ay PHY packets.

Figure 12:
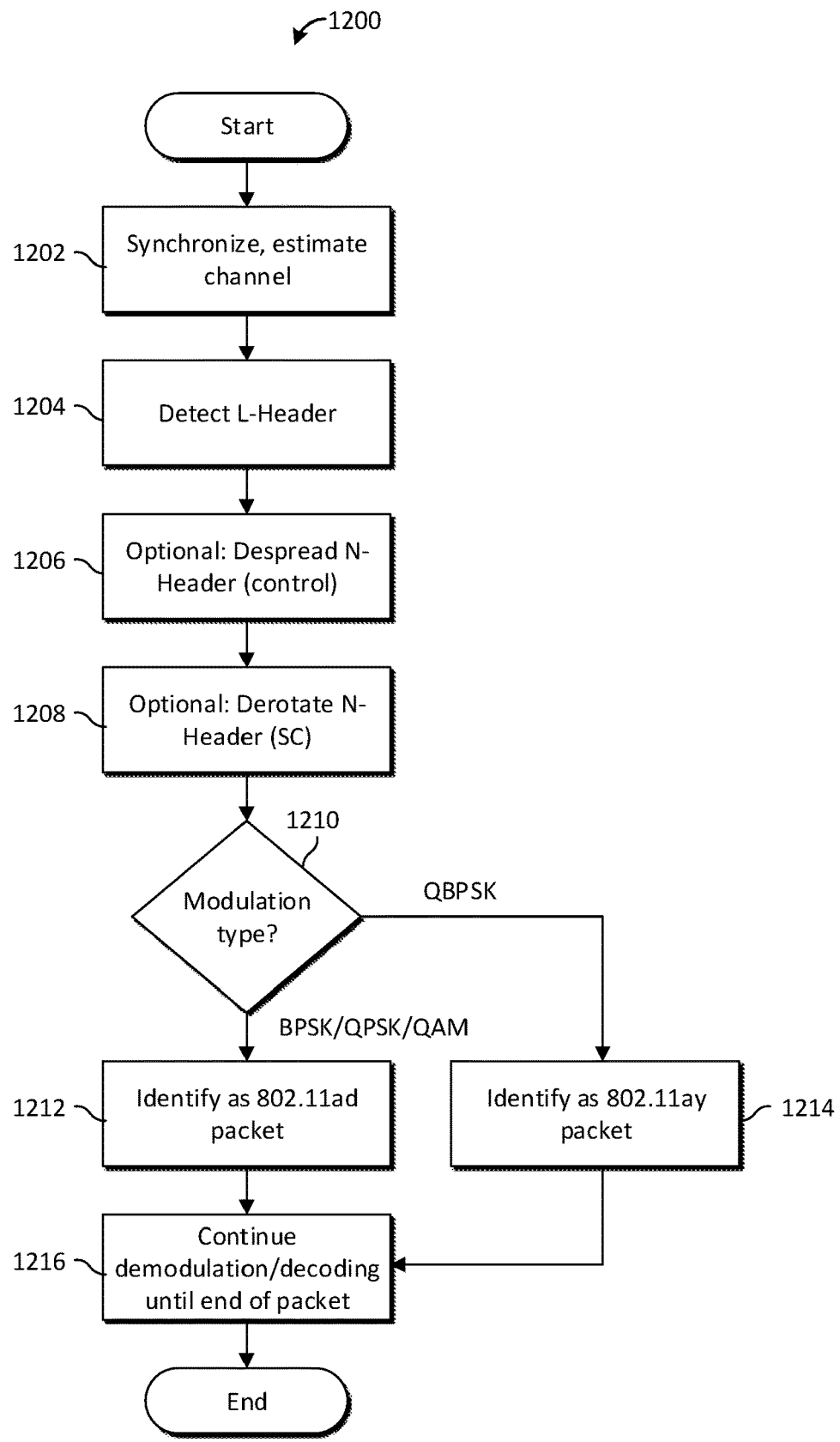

FIG. 12 is a diagram of an auto-detection method 1200. The auto-detection method 1200 may be indicative of operations occurring on an 802.11ay receiver when auto-detecting an 802.11ay or 802.11ad control or SC PHY packet.

The auto-detection method 1200 begins by receiving a packet, synchronizing with the transmitter, and performing channel estimation (step 1202). The L-Header is detected within the received packet (step 1204). Because the L-Header in an 802.11ay packet corresponds to the header 206 in an 802.11ad packet, the L-Header of the received packet may be detected regardless of whether the received packet is an 802.11ad or an 802.11ay packet.

If the packet is a control packet, the N-Header symbols are despread so that an attempt may be made to detect the N-Header (1206). If the received packet is an 802.11ad control packet, then the symbols located after the L-Header will be payload symbols, which are differential BPSK modulated. However, if the received packet is an 802.11ay control packet, then the symbols located after the L-Header will be N-Header symbols, which are rotated to be differential QBPSK modulated, as discussed above with respect to FIGS. 7A-7B.

If the packet is a SC packet, a phase derotation is applied to the N-Header symbols so that an attempt may be made to detect the N-Header (step 1208). If the received packet is an 802.11ad SC packet, then the symbols located after the L-Header will be payload symbols, which can be modulated with π/2-BPSK, π/2-QPSK, or π/2-16QAM modulation. However, if the received packet is an 802.11ay SC packet, then as discussed above, the symbols located after the L-Header will be N-Header symbols, which are modulated with π/2-QBPSK, as discussed above with respect to FIGS. 7A-7B. Accordingly, the symbols are derotated by π/2, as both 802.11ad and 802.11ay SC packets use a form of π/2-shifted modulation.

The modulation type of the despread symbols is determined (step 1210). If the symbols are BPSK, QPSK, or 16QAM modulated, the received packet is identified as an 802.11ad packet (step 1212). If the symbols are QBPSK modulated, the received packet is identified as an 802.11ay packet (step 1214). Once the packet is identified as an 802.11ad or an 802.11ay packet, demodulation and decoding are continued until the end of the received packet (step 1216).

Figure 13:
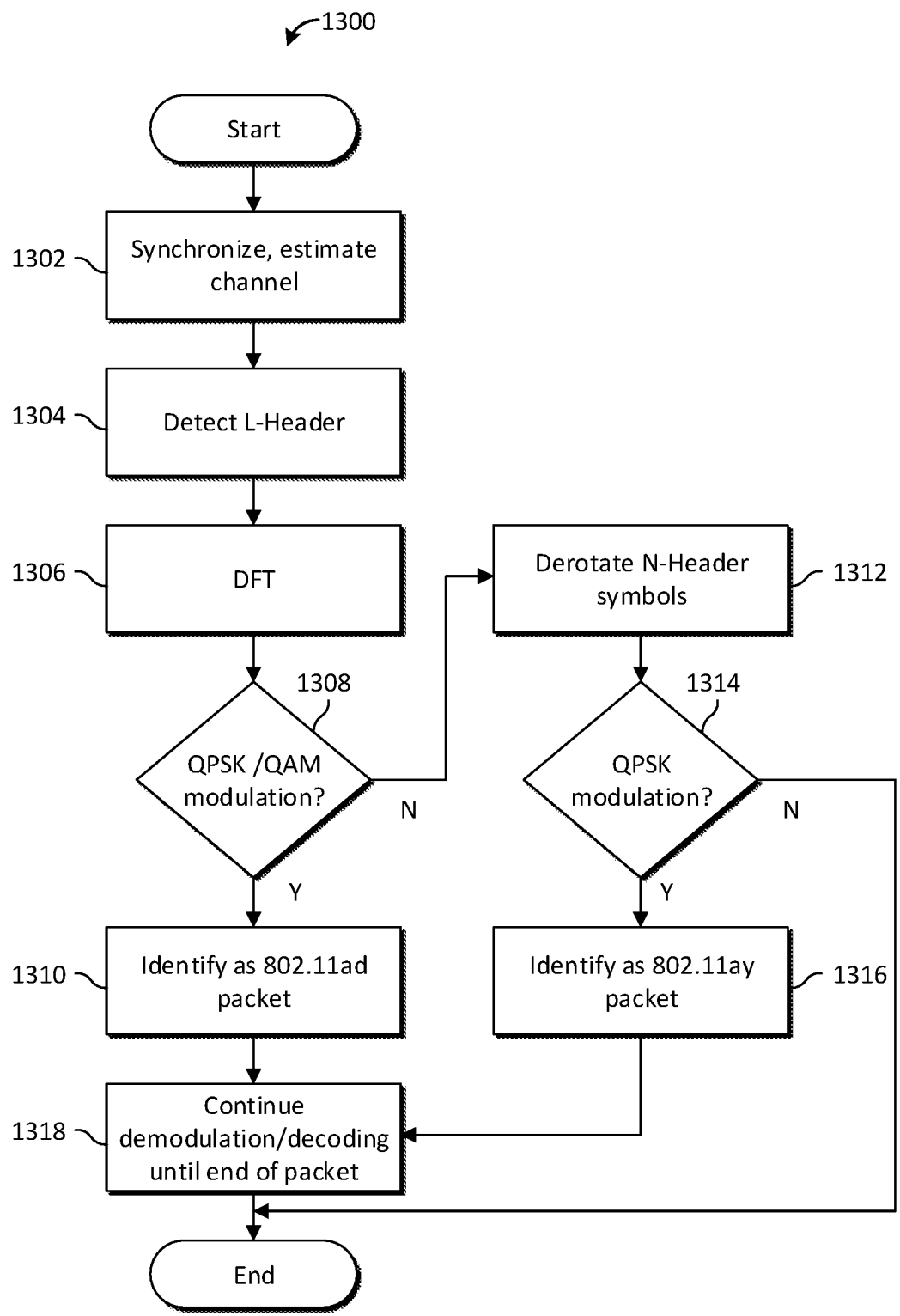

FIG. 13 is a diagram of an auto-detection method 1300. The auto-detection method 1300 may be indicative of operations occurring on an 802.11ay receiver when auto-detecting an 802.11ay or 802.11ad OFDM PHY packet.

The auto-detection method 1300 begins by receiving a packet, synchronizing with the transmitter, and performing channel estimation (step 1302). The L-Header is detected within the received packet (step 1304). Because the L-Header in an 802.11ay packet corresponds to the header 206 in an 802.11ad packet, the L-Header of the received packet may be detected regardless of whether the received packet is an 802.11ad or an 802.11ay packet. A discrete Fourier transform is performed on the received packet, to transform the time-domain symbols of the OFDM packet into frequency-domain symbols (step 1306).

The modulation type of the transformed symbols is determined (step 1308). Because the received packet is an 802.11ad OFDM packet, the symbols located after the L-Header will be payload symbols, which can be modulated with QPSK, 16QAM, or 64QAM modulation. Accordingly, if the symbols are QPSK, 16QAM, or 64QAM modulated, then the received OFDM packet is identified as an 802.11ad packet (step 1310).

However, if the received packet is an 802.11ay OFDM packet, then the symbols located after the L-Header will be N-Header symbols, which are modulated with φ-QPSK, as discussed above with respect to FIGS. 7A-7B. Accordingly, a phase derotation of φ is applied to the N-Header symbols (step 1312). The modulation type of the derotated symbols is determined (step 1314). If the symbols are QPSK modulated, then the received OFDM packet is identified as an 802.11ay packet (step 1316). Once the packet is identified as an 802.11ad or an 802.11ay packet, demodulation and decoding are continued until the end of the received OFDM packet (step 1318).

Figure 14:
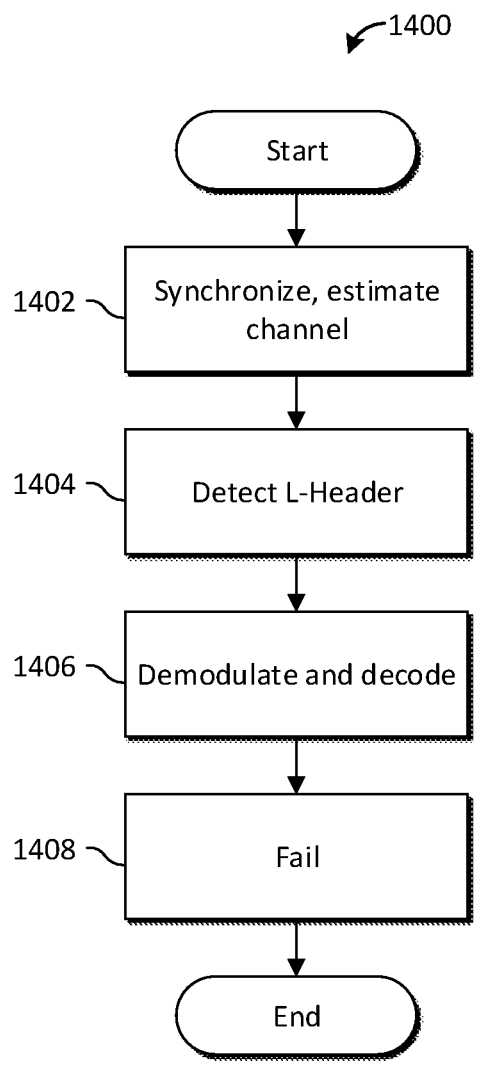

FIG. 14 is a diagram of an auto-detection method 1400. The auto-detection method 1400 may be indicative of operations occurring on an 802.11ad receiver when auto-detecting an 802.11ay PHY packet.

The auto-detection method 1400 begins by receiving a packet, synchronizing with the transmitter, and performing channel estimation (step 1402). The L-Header is detected within the received packet (step 1404). Because the L-Header in an 802.11ay packet corresponds to the header 206 in an 802.11ad packet, the L-Header of the received packet may be detected regardless of whether the receiver is an 802.11ad receiver or an 802.11ay receiver.

The PHY header for the received packet is then demodulated and decoded (step 1406). In embodiments where the packet is a control packet, the received symbols are despread. In embodiments where the packet is a SC packet, the received symbols are derotated. In embodiments where the packet is an OFDM packet, a discrete Fourier transformation (DFT) is performed to convert the time-domain symbols to frequency-domain symbols.

A failure then occurs in the 802.11ad receiver (step 1408). The failure occurs for the same reasons discussed above with respect to step 1006 of FIG. 10.

Figure 15:
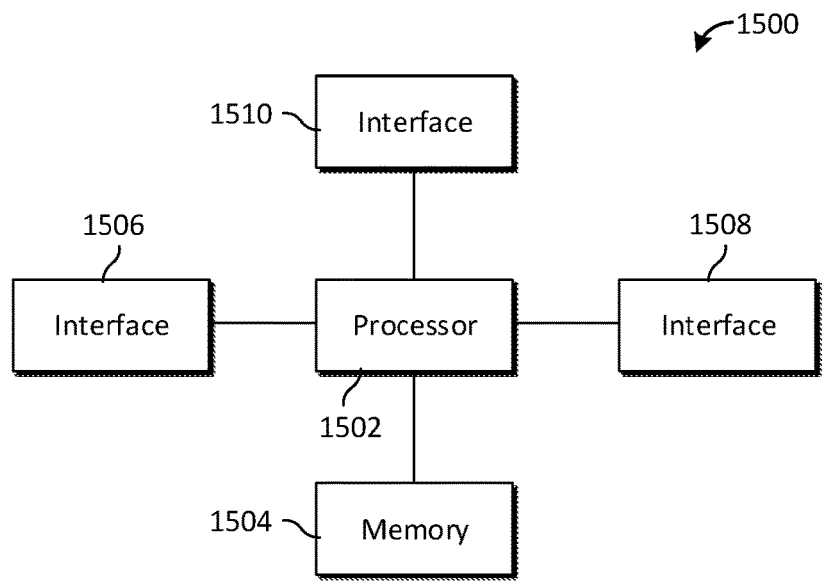
FIG. 15 is a diagram of an embodiment processing system.

FIG. 15 illustrates a block diagram of an embodiment processing system 1500 for performing methods described herein, which may be installed in a host device. As shown, the processing system 1500 includes a processor 1502, a memory 1504, and interfaces 1506-1510, which may (or may not) be arranged as shown in FIG. 15. The processor 1502 may be any component or collection of components adapted to perform computations and/or other processing related tasks, and the memory 1504 may be any component or collection of components adapted to store programming and/or instructions for execution by the processor 1502. In an embodiment, the memory 1504 includes a non-transitory computer readable medium. The interfaces 1506, 1508, 1510 may be any component or collection of components that allow the processing system 1500 to communicate with other devices/components and/or a user. For example, one or more of the interfaces 1506, 1508, 1510 may be adapted to communicate data, control, or management messages from the processor 1502 to applications installed on the host device and/or a remote device. As another example, one or more of the interfaces 1506, 1508, 1510 may be adapted to allow a user or user device (e.g., personal computer (PC), etc.) to interact/communicate with the processing system 1500. The processing system 1500 may include additional components not depicted in FIG. 15, such as long term storage (e.g., non-volatile memory, etc.).

In some embodiments, the processing system 1500 is included in a network device that is accessing, or part otherwise of, a telecommunications network. In one example, the processing system 1500 is in a network-side device in a wireless or wireline telecommunications network, such as a base station, a relay station, a scheduler, a controller, a gateway, a router, an applications server, or any other device in the telecommunications network. In other embodiments, the processing system 1500 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Figure 16:
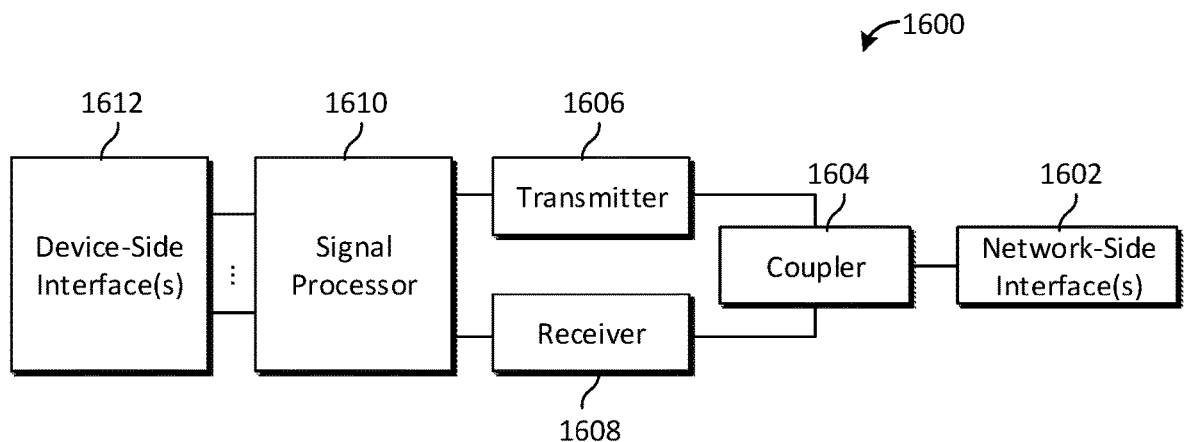
FIG. 16 is a block diagram of a transceiver.

In some embodiments, one or more of the interfaces 1506, 1508, 1510 connects the processing system 1500 to a transceiver adapted to transmit and receive signaling over the telecommunications network. FIG. 16 illustrates a block diagram of a transceiver 1600 adapted to transmit and receive signaling over a telecommunications network. The transceiver 1600 may be installed in a host device. As shown, the transceiver 1600 comprises a network-side interface 1602, a coupler 1604, a transmitter 1606, a receiver 1608, a signal processor 1610, and a device-side interface 1612. The network-side interface 1602 may include any component or collection of components adapted to transmit or receive signaling over a wireless or wireline telecommunications network. The coupler 1604 may include any component or collection of components adapted to facilitate bi-directional communication over the network-side interface 1602. The transmitter 1606 may include any component or collection of components (e.g., up-converter, power amplifier, etc.) adapted to convert a baseband signal into a modulated carrier signal suitable for transmission over the network-side interface 1602. The receiver 1608 may include any component or collection of components (e.g., down-converter, low noise amplifier, etc.) adapted to convert a carrier signal received over the network-side interface 1602 into a baseband signal. The signal processor 1610 may include any component or collection of components adapted to convert a baseband signal into a data signal suitable for communication over the device-side interface(s) 1612, or vice-versa. The device-side interface(s) 1612 may include any component or collection of components adapted to communicate data-signals between the signal processor 1610 and components within the host device (e.g., the processing system 1500, local area network (LAN) ports, etc.).

The transceiver 1600 may transmit and receive signaling over any type of communications medium. In some embodiments, the transceiver 1600 transmits and receives signaling over a wireless medium. For example, the transceiver 1600 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1602 comprises one or more antenna/radiating elements. For example, the network-side interface 1602 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 1600 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method comprising:
   transmitting, by a wireless transmitter, in a 60 GHz frequency band a wireless packet comprising a first header and a second header, the first header carrying a plurality of bits, a logical value of a subset of the plurality of bits in the first header indicating the presence of the second header in the wireless packet, both of the first header and the second header being physical layer packet headers, the first header carrying a first parameter for an IEEE 802.11ad packet type, the second header carrying a second parameter for an IEEE 802.11ay packet type, the second parameter indicating a number of bonded channels, wherein channel bonding is not supported by the IEEE 802.11ad packet type.

2. The method of claim 1, wherein the second parameter for the 802.11ay packet type in the second header further comprises a MIMO type, a MIMO order, or a combination thereof.

3. The method of claim 1, wherein the wireless packet is a control packet, and wherein the plurality of bits includes 24 bits.

4. The method of claim 1, wherein the wireless packet is one of a SC or OFDM packet, and wherein the plurality of bits includes 48 bits.

5. The method of claim 1, wherein the wireless packet further comprises a payload and a training field.

6. The method of claim 1, wherein the wireless packet further comprises a first short training field, a second short training field, a first channel estimation field, and a second channel estimation field.

7. A method comprising:
receiving, by a wireless receiver, on a 60 GHz band a wireless packet comprising a first header and a second header, the first header carrying a plurality of bits, both of the first header and the second header being physical layer packet headers, the first header carrying a first parameter for an IEEE 802.11ad packet type, the second header carrying a second parameter for an 802.11ay packet type, the second parameter indicating a number of bonded channels, wherein channel bonding is not supported by the IEEE 802.11ad packet type; and
determining, by the wireless receiver, the presence of the second header in the wireless packet according to a logical value of a subset of the plurality of bits in the first header.

8. The method of claim 7, wherein the second parameter for the 802.11ay packet type in the second header further comprises a MIMO type, a MIMO order, or a combination thereof.

9. The method of claim 7, wherein the first packet type is an IEEE 802.11ad packet type and the 802.11ay packet type is an IEEE 802.11ay packet type.

10. The method of claim 7, wherein the wireless packet is a control packet, and wherein the plurality of bits includes 24 bits.

11. The method of claim 7, wherein the wireless packet is one of a SC or OFDM packet, and wherein the plurality of bits includes 48 bits.

12. The method of claim 7, wherein the wireless packet further comprises a payload and a training field.

13. The method of claim 7, wherein the wireless packet further comprises a first short training field, a second short training field, a first channel estimation field, and a second channel estimation field.

14. A method comprising:
transmitting, by a wireless transmitter, on a 60 GHz band a wireless packet comprising a first header, a second header, a payload, and a training field, the first header carrying a first parameter for an IEEE 802.11ad packet type, the second header carrying a second parameter for an 802.11ay packet type, the second parameter indicating a number of bonded channels, and wherein the first header being modulated with a first modulation scheme to indicate the presence of the second header in the wireless packet, wherein the first header and the second header are both physical layer packet headers, and wherein channel bonding is not supported by the IEEE 802.11ad packet type.

15. The method of claim 14, wherein the wireless packet further comprises a first short training field, a first channel estimation field, and a second channel estimation field, and wherein the second header is positioned between the first header and the payload in the wireless packet.

16. The method of claim 14, wherein the second header is modulated with a second modulation scheme different than the first modulation scheme.

17. The method of claim 16, wherein the first modulation scheme comprises differential BPSK, wherein the second modulation scheme comprises differential QBPSK, and wherein the wireless packet comprises a control packet.

18. The method of claim 16, wherein the first modulation scheme comprises π/2-shifted BPSK, wherein the second modulation scheme comprises π/2-shifted QBPSK, and wherein the wireless packet comprises a single carrier packet.

19. The method of claim 16, wherein the first modulation scheme comprises QPSK, wherein the second modulation scheme comprises φ-shifted QPSK, wherein φ is a phase shift such that φ≠π/2, and wherein the wireless packet comprises an orthogonal frequency-division multiplexing packet.

20. A method comprising:
transmitting, by a wireless transmitter, on a 60 GHz band a wireless packet comprising a first header, a second header, a payload, and a training field, the first header carrying a plurality of bits and a header check sequence for the plurality of bits, the plurality of bits being arranged with an arrangement to indicate the presence of the second header in the wireless packet, the header check sequence determined before arranging the plurality of bits, both of the first header and the second header being physical layer packet headers, the first header carrying a first parameter for an IEEE 802.11ad packet type, the second header carrying a second parameter for an 802.11ay packet type, the second parameter indicating a number of bonded channels, wherein channel bonding is not supported by the IEEE 802.11ad packet type.

21. The method of claim 20, wherein the arrangement of the plurality of bits is determined according to a known bit interleaving pattern.

22. The method of claim 20, wherein the arrangement of the plurality of bits is determined according to a known bit scrambling pattern.

* * * * *